US012677609B2

(12) United States Patent　　　(10) Patent No.: US 12,677,609 B2
Chae et al.　　　　　　　　　　　(45) Date of Patent: Jul. 7, 2026

(54) GERMANIUM AND SILICON STACKS FOR 3D NAND

(71) Applicant: Applied Materials, Inc., Santa Clara, CA (US)

(72) Inventors: Sieun Chae, San Jose, CA (US); Susmit Singha Roy, Campbell, CA (US); Abhijit Basu Mallick, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 620 days.

(21) Appl. No.: 17/947,318

(22) Filed: Sep. 19, 2022

(65) Prior Publication Data

US 2023/0090426 A1　　Mar. 23, 2023

Related U.S. Application Data

(60) Provisional application No. 63/246,006, filed on Sep. 20, 2021.

(51) Int. Cl.
　　*H10P 14/20*　　　(2026.01)
　　*H10P 14/60*　　　(2026.01)
　　　　　　(Continued)

(52) U.S. Cl.
　　CPC ...... *H10P 14/6319* (2026.01); *H10P 14/3411* (2026.01); *H10P 14/69215* (2026.01); *H10P 95/90* (2026.01)

(58) Field of Classification Search
　　CPC . H10D 88/01; H01L 21/02532; H01L 21/477; H01L 21/02252; H01L 21/02164;
　　　　　　(Continued)

(56) References Cited

U.S. PATENT DOCUMENTS

| | | | |
|---|---|---|---|
| 2005/0074939 A1 | 4/2005 | Ho et al. | |
| 2007/0004230 A1 | 1/2007 | Johnston et al. | |

(Continued)

FOREIGN PATENT DOCUMENTS

| | | |
|---|---|---|
| KR | 20140058357 A | 5/2014 |
| KR | 20140103189 A | 8/2014 |
| KR | 20210024423 A | 3/2021 |

OTHER PUBLICATIONS

Application No. PCT/US2022/043701, International Search Report and Written Opinion, Mailed on Jan. 2, 2023, 8 pages.

(Continued)

*Primary Examiner* — Matthew C Landau
*Assistant Examiner* — Vincent Kipkemoi Rono
(74) *Attorney, Agent, or Firm* — Kilpatrick Townsend & Stockton LLP

(57)　　　ABSTRACT

Exemplary semiconductor processing methods may include providing a silicon-containing precursor to a processing region of a semiconductor processing chamber. A substrate may be disposed within the processing region of the semiconductor processing chamber. The methods may include forming a plasma of the silicon-containing precursor in the processing region and forming a first layer of material on the substrate. The first layer of material may include silicon oxide. The methods may include providing a germanium-containing precursor to the processing region of the semiconductor processing chamber and forming a plasma of the germanium-containing precursor in the processing region. Forming the plasma of the germanium-containing precursor may be performed at a plasma power of greater than or about 500 W. The methods may include forming a second layer of material on the substrate. The second layer of material may include germanium oxide.

20 Claims, 3 Drawing Sheets

(51) Int. Cl.
H10P 14/692 (2026.01)
H10P 95/90 (2026.01)

(58) Field of Classification Search
CPC ............. H01L 21/022; H01L 21/02211; H01L 21/02274; H01L 21/0228; H01L 21/68785; C23C 16/407; C23C 16/4586; C23C 16/505; C23C 16/401; H01J 37/32174; H01J 37/32568; H01J 37/32183
See application file for complete search history.

(56) References Cited

U.S. PATENT DOCUMENTS

| | | | |
|---|---|---|---|
| 2008/0248644 | A1 | 10/2008 | Liu |
| 2012/0306058 | A1 | 12/2012 | Vermang |
| 2014/0120738 | A1* | 5/2014 | Jung ................... H10P 14/6922 |
| | | | 438/778 |
| 2016/0225615 | A1 | 8/2016 | Hunks et al. |
| 2017/0117498 | A1* | 4/2017 | Takechi ............. H10D 30/6758 |
| 2019/0131124 | A1 | 5/2019 | Kohen et al. |
| 2021/0057275 | A1 | 2/2021 | Pierreux et al. |
| 2021/0104399 | A1* | 4/2021 | Kuroda ............... H10P 14/6336 |
| 2021/0134592 | A1 | 5/2021 | Mutyala et al. |

OTHER PUBLICATIONS

Korean Application No. 10-2024-7012952, Notice of Decision to Grant mailed on Oct. 28, 2025, 4 pages (1 page of English Translation and 3 pages of original documents).
SG11202401865W, "Written Opinion with Search Report", Apr. 25, 2026, 8 pages.

* cited by examiner

GERMANIUM AND SILICON STACKS FOR 3D NAND

CROSS-REFERENCE TO RELATED APPLICATIONS

This application claims the benefit of, and priority to U.S. Provisional Application Ser. No. 63/246,006, filed Sep. 20, 2021, which is hereby incorporated by reference in its entirety for all purposes.

TECHNICAL FIELD

The present technology relates to semiconductor processes and materials. More specifically, the present technology relates to forming and processing layered memory structures.

BACKGROUND

Integrated circuits are made possible by processes which produce intricately patterned material layers on substrate surfaces. Producing patterned material on a substrate requires controlled methods of formation and removal of exposed material. Stacked memory, such as vertical or 3D NAND, may include the formation of a series of alternating layers of dielectric materials through which a number of memory holes or apertures may be etched. Material properties of the layers of materials, as well as process conditions and materials for etching, may affect the uniformity of the formed structures. Material defects may lead to inconsistent patterning, which may further affect the uniformity of the formed structures.

Thus, there is a need for improved systems and methods that can be used to produce high quality devices and structures. These and other needs are addressed by the present technology.

SUMMARY

Exemplary methods of forming semiconductor structures may include providing a silicon-containing precursor to a processing region of a semiconductor processing chamber. A substrate may be disposed within the processing region of the semiconductor processing chamber. The methods may include forming a plasma of the silicon-containing precursor in the processing region and forming a first layer of material on the substrate. The first layer of material may include silicon oxide. The methods may include providing a germanium-containing precursor to the processing region of the semiconductor processing chamber and forming a plasma of the germanium-containing precursor in the processing region. Forming the plasma of the germanium-containing precursor may be performed at a plasma power of greater than or about 500 W. The methods may include forming a second layer of material on the substrate. The second layer of material may include germanium oxide.

In some embodiments, a temperature within the semiconductor processing chamber may be maintained at less than or about 550° C. while forming the first layer of material and the second layer of material on the substrate. A pressure within the semiconductor processing chamber may be maintained at less than or about 6 Torr while forming the first layer of material and the second layer of material on the substrate. Forming the plasma of the silicon-containing precursor may be performed at a plasma power of less than or about 500 W. Forming the plasma of the germanium-containing precursor may be performed at a plasma power of greater than or about 900 W. An atomic ratio of germanium to oxygen in the second layer of material may be less than or about 1:2. Each layer of material may have a thickness between about 10 nm and about 30 nm. The methods may include forming alternating sets of the first layer of material and the second layer of material on the substrate. The methods may further include annealing the substrate subsequent forming alternating sets of the first layer of material and the second layer of material.

Some embodiments of the present technology may encompass semiconductor processing methods. The methods may include forming a first layer of material on a substrate in a processing region of a semiconductor processing chamber. The first layer of material may include silicon oxide. The methods may include forming a second layer of material on the substrate. The second layer of material may include germanium oxide. An atomic ratio of germanium to oxygen in the second layer of material may be less than or about 3:2. The methods may include annealing the substrate subsequent forming the first layer and the second layer on the substrate.

In some embodiments, a temperature within the semiconductor processing chamber may be maintained at less than or about 550° C. while forming the first layer of material and the second layer of material on the substrate. A pressure within the semiconductor processing chamber may be maintained at less than or about 6 Torr while forming the first layer of material and the second layer of material on the substrate. The atomic ratio of germanium to oxygen in the second layer of material may be less than or about 2:3. The methods may include forming a plasma of a germanium-containing precursor in the processing region prior to forming the second layer of material on the substrate. Forming the plasma of the germanium-containing precursor may be performed at a plasma power of greater than or about 900 W. The methods may include forming alternating sets of the first layer of material and the second layer of material on the substrate. The alternating sets of the first layer of material and the second layer of material may include at least 50 layers of alternating layers of silicon oxide and germanium oxide.

Some embodiments of the present technology may encompass semiconductor processing methods. The methods may include providing a silicon-containing precursor and an oxygen-containing precursor to a processing region of a semiconductor processing chamber. A substrate may be disposed within the processing region of the semiconductor processing chamber. The methods may include forming a plasma of the silicon-containing precursor and the oxygen-containing precursor in the processing region. The methods may include forming a first layer of material on the substrate. The first layer of material may include silicon oxide. The methods may include providing a germanium-containing precursor and an oxygen-containing precursor to the processing region of the semiconductor processing chamber. The methods may include forming a plasma of the germanium-containing precursor and the oxygen-containing precursor in the processing region. The methods may include forming a second layer of material on the substrate. The second layer of material may include germanium oxide. A ratio of germanium to oxygen in the second layer of material may be less than or about 1:2.

In some embodiments, the oxygen-containing precursor provided with the silicon-containing precursor may be a similar precursor as the oxygen-containing precursor provided with the germanium-containing precursor. A flow rate of the oxygen-containing precursor may be increased from a first flow rate provided while providing the silicon-containing precursor to a second flow rate while providing the germanium-containing precursor. Forming the plasma of the germanium-containing precursor may be performed at a plasma power of greater than or about 800 W. A temperature within the semiconductor processing chamber may be maintained at less than or about 550° C. while forming the first layer of material and the second layer of material on the substrate. A pressure within the semiconductor processing chamber may be maintained at less than or about 6 Torr while forming the first layer of material and the second layer of material on the substrate.

Such technology may provide numerous benefits over conventional systems and techniques. For example, the processes and structures may protect against defect formation during etching operations. Additionally, the operations of embodiments of the present technology may improve memory hole formation through the stacks. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1:
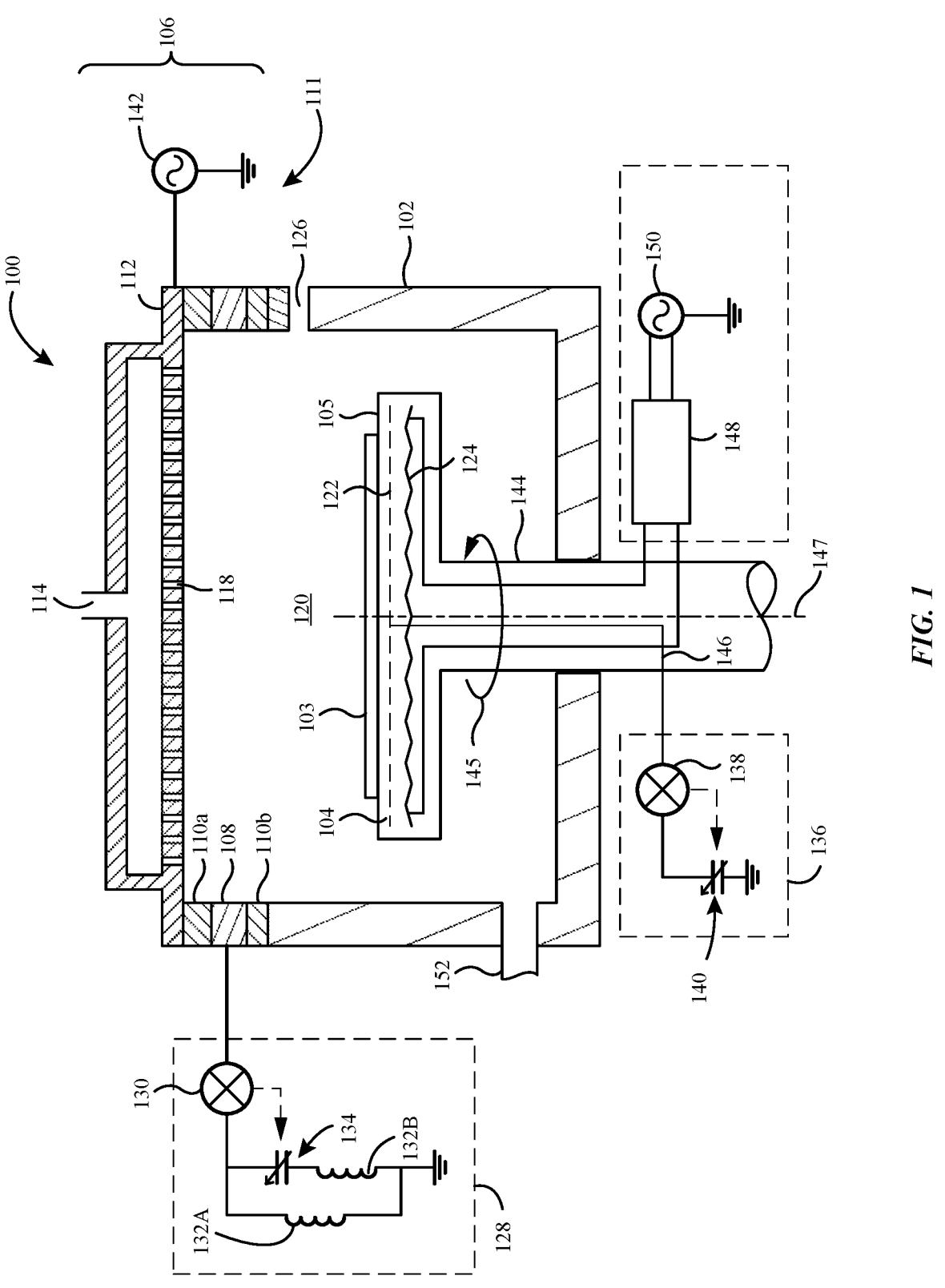
FIG. 1 shows a schematic cross-sectional view of an exemplary processing chamber according to some embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include superfluous or exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

As 3D NAND structures grow in the number of cells being formed, the aspect ratios of individual layers and other structures increase, sometimes dramatically. During 3D NAND processing, stacks of placeholder layers and dielectric materials may form the inter-electrode dielectric or inter-poly dielectric layers. These placeholder layers may have a variety of operations performed to place structures before fully removing the material and replacing it with metal. The inter-poly dielectric layers are often formed overlying a conductor layer, such as polysilicon, for example. An etch process may be performed to remove the material of the placeholder layers prior to replacing it with metal.

A wet etch may be used to remove the material of the placeholder layers, such as silicon nitride, for example. The wet etch may involve immersing the structure having the stacks of placeholder layers and dielectric materials into an etch fluid, such as phosphoric acid, for example. The etch fluid may intend to remove the placeholder layer without substantially removing the dielectric material such that metal may be deposited to replace the removed placeholder material.

Conventional technologies may struggle with uniformity and control during the etch removal process due to material differences between the two layer types, as well as the etch process and materials. For example, conventional technologies may not be able to uniformly remove the placeholder layers during the etch process. The present technology overcomes these issues by adjusting the material used in the placeholder layers while forming the structure having the stacks of placeholder layers and dielectric materials, which may accommodate or limit one or more challenges that may otherwise occur. For example, the present technology may employ a germanium oxide placeholder layer instead of a conventional silicon nitride placeholder layer. By utilizing a germanium oxide material, the present technology may allow the etch process to be performed by a dry etch process, which may be more selective than conventional wet processing. Additionally, the present technology may overcome historical issues with germanium films. Conventionally formed germanium oxide may be temperature sensitive, and downstream processing may include an anneal, which can cause the germanium to diffuse into the silicon material, and in some situations may cause the separate layers to become fully soluble and ruin the layered structure. The present structure may form the germanium oxide to improve temperature sensitivity, ensuring the layers may be maintained discrete during subsequent processing. Although the remaining disclosure will routinely identify specific materials and semiconductor structures utilizing the disclosed technology, it will be readily understood that the systems, methods, and materials are equally applicable to a number of other structures that may benefit from aspects of the present technology. Accordingly, the technology should not be considered to be so limited as for use with 3D NAND processes or materials alone. Moreover, although an exemplary chamber is described to provide foundation for the present technology, it is to be understood that the present technology can be applied to virtually any semiconductor processing chamber that may allow the operations described.

FIG. 1 shows a cross-sectional view of an exemplary semiconductor processing chamber system 100 according to some embodiments of the present technology. Semiconductor processing chamber 100 may be utilized to form film layers according to some embodiments of the present technology, although it is to be understood that the methods may similarly be performed in any chamber within which film formation may occur. The semiconductor processing chamber 100 may include a chamber body 102, a substrate support 104 disposed inside the chamber body 102, and a lid assembly 106 coupled with the chamber body 102 and enclosing the substrate support 104 in a processing volume 120. A substrate 103 may be provided to the processing volume 120 through an opening 126, which may be conventionally sealed for processing using a slit valve or door. The substrate 103 may be seated on a surface 105 of the substrate support during processing. The substrate support 104 may be rotatable, as indicated by the arrow 145, along an axis 147, where a shaft 144 of the substrate support 104 may be located. Alternatively, the substrate support 104 may be lifted up to rotate as necessary during a deposition process.

A plasma profile modulator 111 may be disposed in the semiconductor processing chamber 100 to control plasma distribution across the substrate 103 disposed on the substrate support 104. The plasma profile modulator 111 may include a first electrode 108 that may be disposed adjacent to the chamber body 102, and may separate the chamber body 102 from other components of the lid assembly 106. The first electrode 108 may be part of the lid assembly 106, or may be a separate sidewall electrode. The first electrode 108 may be an annular or ring-like member, and may be a ring electrode. The first electrode 108 may be a continuous loop around a circumference of the semiconductor processing chamber 100 surrounding the processing volume 120, or may be discontinuous at selected locations if desired. The first electrode 108 may also be a perforated electrode, such as a perforated ring or a mesh electrode, or may be a plate electrode, such as, for example, a secondary gas distributor.

One or more isolators 110a, 110b, which may be a dielectric material such as a ceramic or metal oxide, for example aluminum oxide and/or aluminum nitride, may contact the first electrode 108 and separate the first electrode 108 electrically and thermally from a gas distributor 112 and from the chamber body 102. The gas distributor 112 may define apertures 118 for distributing process precursors into the processing volume 120. The gas distributor 112 may be coupled with a first source of electric power 142, such as an RF generator, RF power source, DC power source, pulsed DC power source, pulsed RF power source, or any other power source that may be coupled with the processing chamber. In some embodiments, the first source of electric power 142 may be an RF power source.

The gas distributor 112 may be a conductive gas distributor or a non-conductive gas distributor. The gas distributor 112 may also be formed of conductive and non-conductive components. For example, a body of the gas distributor 112 may be conductive while a faceplate of the gas distributor 112 may be non-conductive. The gas distributor 112 may be powered, such as by the first source of electric power 142 as shown in FIG. 1, or the gas distributor 112 may be coupled with ground in some embodiments.

The first electrode 108 may be coupled with a first tuning circuit 128 that may control a ground pathway of the semiconductor processing chamber 100. The first tuning circuit 128 may include a first electronic sensor 130 and a first electronic controller 134. The first electronic controller 134 may be or include a variable capacitor or other circuit elements. The first tuning circuit 128 may be or include one or more inductors 132. The first tuning circuit 128 may be any circuit that enables variable or controllable impedance under the plasma conditions present in the processing volume 120 during processing. In some embodiments as illustrated, the first tuning circuit 128 may include a first circuit leg and a second circuit leg coupled in parallel between ground and the first electronic sensor 130. The first circuit leg may include a first inductor 132A. The second circuit leg may include a second inductor 132B coupled in series with the first electronic controller 134. The second inductor 132B may be disposed between the first electronic controller 134 and a node connecting both the first and second circuit legs to the first electronic sensor 130. The first electronic sensor 130 may be a voltage or current sensor and may be coupled with the first electronic controller 134, which may afford a degree of closed-loop control of plasma conditions inside the processing volume 120.

A second electrode 122 may be coupled with the substrate support 104. The second electrode 122 may be embedded within the substrate support 104 or coupled with a surface of the substrate support 104. The second electrode 122 may be a plate, a perforated plate, a mesh, a wire screen, or any other distributed arrangement of conductive elements. The second electrode 122 may be a tuning electrode, and may be coupled with a second tuning circuit 136 by a conduit 146, for example a cable having a selected resistance, such as 50 ohms, for example, disposed in the shaft 144 of the substrate support 104. The second tuning circuit 136 may have a second electronic sensor 138 and a second electronic controller 140, which may be a second variable capacitor. The second electronic sensor 138 may be a voltage or current sensor, and may be coupled with the second electronic controller 140 to provide further control over plasma conditions in the processing volume 120.

A third electrode 124, which may be a bias electrode and/or an electrostatic chucking electrode, may be coupled with the substrate support 104. The third electrode may be coupled with a second source of electric power 150 through a filter 148, which may be an impedance matching circuit. The second source of electric power 150 may be DC power, pulsed DC power, RF bias power, a pulsed RF source or bias power, or a combination of these or other power sources. In some embodiments, the second source of electric power 150 may be an RF bias power.

The lid assembly 106 and substrate support 104 of FIG. 1 may be used with any processing chamber for plasma or thermal processing. In operation, the semiconductor processing chamber 100 may afford real-time control of plasma conditions in the processing volume 120. The substrate 103 may be disposed on the substrate support 104, and process gases may be flowed through the lid assembly 106 using an inlet 114 according to any desired flow plan. Gases may exit the semiconductor processing chamber 100 through an outlet 152. Electric power may be coupled with the gas distributor 112 to establish a plasma in the processing volume 120. The substrate may be subjected to an electrical bias using the third electrode 124 in some embodiments.

Upon energizing a plasma in the processing volume 120, a potential difference may be established between the plasma and the first electrode 108. A potential difference may also be established between the plasma and the second electrode 122. The electronic controllers 134, 140 may then be used to adjust the flow properties of the ground paths represented by the two tuning circuits 128 and 136. A set point may be delivered to the first tuning circuit 128 and the second tuning circuit 136 to provide independent control of deposition rate and of plasma density uniformity from center to edge. In embodiments where the electronic controllers may both be variable capacitors, the electronic sensors may adjust the variable capacitors to maximize deposition rate and minimize thickness non-uniformity independently.

Each of the tuning circuits 128, 136 may have a variable impedance that may be adjusted using the respective electronic controllers 134, 140. Where the electronic controllers 134, 140 are variable capacitors, the capacitance range of each of the variable capacitors, and the inductances of the first inductor 132A and the second inductor 132B, may be chosen to provide an impedance range. This range may depend on the frequency and voltage characteristics of the plasma, which may have a minimum in the capacitance range of each variable capacitor. Hence, when the capacitance of the first electronic controller 134 is at a minimum or maximum, impedance of the first tuning circuit 128 may be high, resulting in a plasma shape that has a minimum aerial or lateral coverage over the substrate support. When the capacitance of the first electronic controller 134 approaches a value that minimizes the impedance of the first tuning circuit 128, the aerial coverage of the plasma may grow to a maximum, effectively covering the entire working area of the substrate support 104. As the capacitance of the first electronic controller 134 deviates from the minimum impedance setting, the plasma shape may shrink from the chamber walls and aerial coverage of the substrate support may decline. The second electronic controller 140 may have a similar effect, increasing and decreasing aerial coverage of the plasma over the substrate support as the capacitance of the second electronic controller 140 may be changed.

The electronic sensors 130, 138 may be used to tune the respective circuits 128, 136 in a closed loop. A set point for current or voltage, depending on the type of sensor used, may be installed in each sensor, and the sensor may be provided with control software that determines an adjustment to each respective electronic controller 134, 140 to minimize deviation from the set point. Consequently, a plasma shape may be selected and dynamically controlled during processing. It is to be understood that, while the foregoing discussion is based on electronic controllers 134, 140, which may be variable capacitors, any electronic component with adjustable characteristic may be used to provide tuning circuits 128 and 136 with adjustable impedance.

Figure 2:
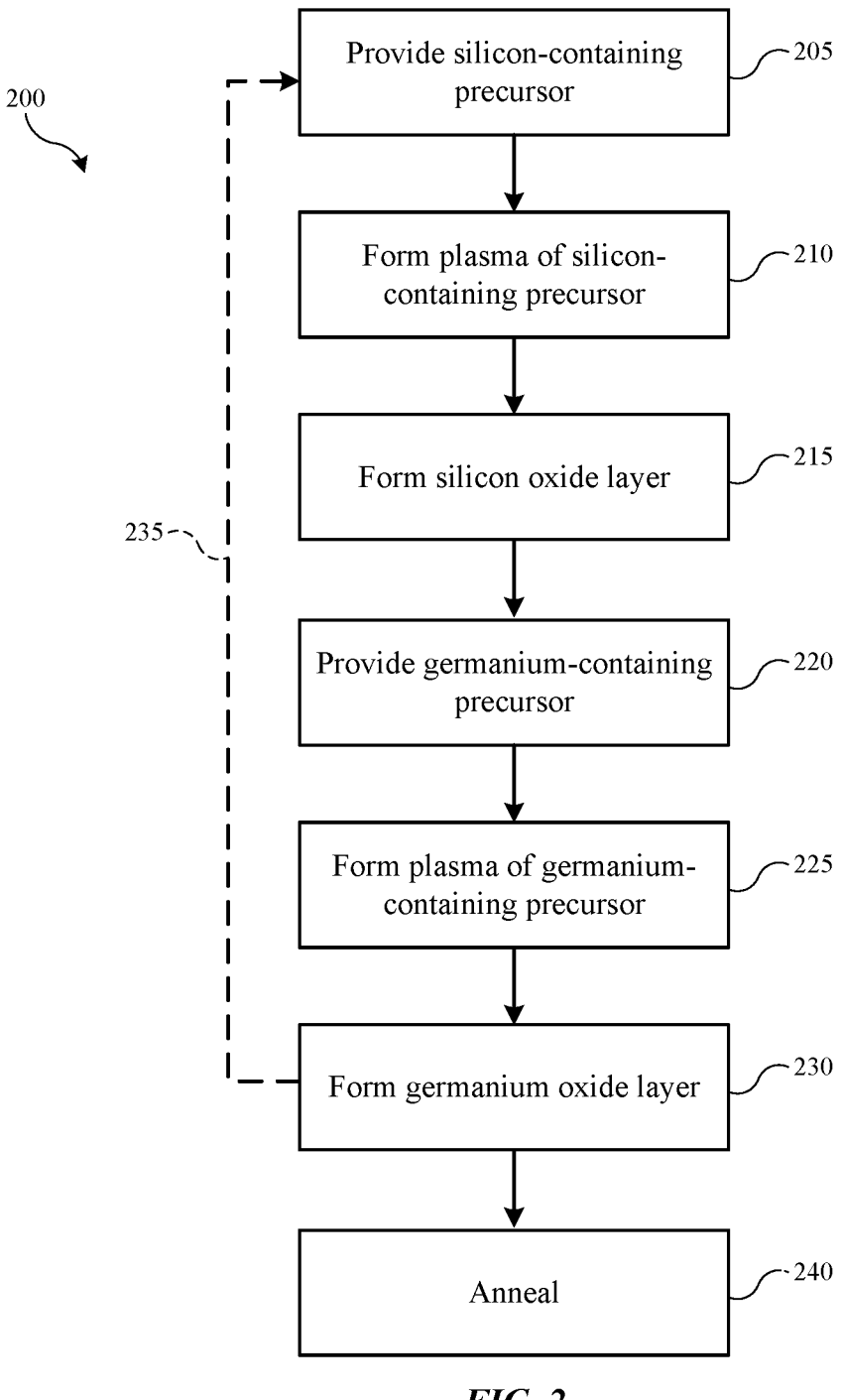
FIG. 2 shows selected operations in a formation method according to some embodiments of the present technology.
Figure 3A:
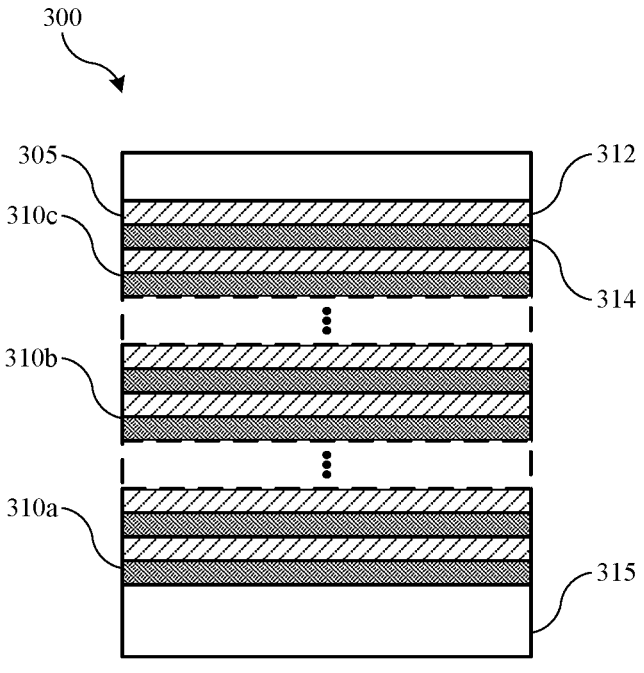
FIGS. 3A-B shows show exemplary schematic cross-sectional structures in which material layers are included and produced according to some embodiments of the present technology.
Figure 3B:
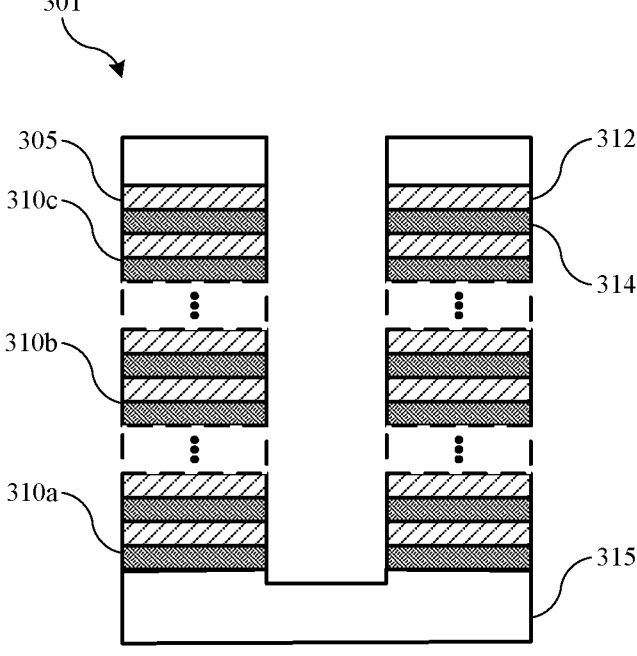

FIG. 2 shows operations of an exemplary method 200 of semiconductor processing according to some embodiments of the present technology. The method may be performed in a variety of processing chambers, including the semiconductor processing chamber 100 described above, as well as any other chamber in which plasma deposition may be performed. Method 200 may include a number of optional operations, which may or may not be specifically associated with some embodiments of methods according to the present technology. It is to be understood that method 200 may be performed on any number of semiconductor structures or substrates 315, including exemplary structure 300 as illustrated in FIG. 3A on which alternating layers of material may be formed. It is to be understood that FIGS. 3A-B illustrate only partial schematic views, and a substrate may contain any number of structural sections having aspects as illustrated in the figures, as well as alternative structural aspects that may still benefit from operations of the present technology.

Prior to the first operation of the method 200, the substrate 315 may be processed in one or more ways before being placed within a processing region of a semiconductor processing chamber 100 in which method 200 may be performed. Some or all of the operations may be performed in chambers or system tools as previously described, or may be performed in different chambers on the same system tool, which may include the semiconductor processing chamber in which the operations of method 200 may be performed.

Substrate 315 may have a substantially planar surface or an uneven surface in embodiments. The substrate may be a material such as crystalline silicon, silicon oxide, strained silicon, silicon germanium, doped or undoped polysilicon, doped or undoped silicon wafers, patterned or non-patterned wafers, silicon on insulator, carbon doped silicon oxides, silicon nitride, doped silicon, germanium, gallium arsenide, or sapphire. The substrate 315 may have various dimensions, such as 200 mm or 300 mm diameter wafers, as well as rectangular or square panels.

Method 200 may include a number of optional operations as illustrated, which may or may not be specifically associated with some embodiments of methods according to the present technology. For example, many of the operations are described in order to provide a broader scope of the structural formation, but are not critical to the technology, or may be performed by alternative methodology as will be discussed further below. As previously discussed, method 200 may describe operations shown schematically in FIG. 3A, the illustration of which will be described in conjunction with the operations of method 200.

Structure 300 may illustrate a partial view of a stack of alternating layers of materials, which in some embodiments may be used in 3D NAND memory formation. The alternating layers of material may be produced by any number of methods, including plasma-enhanced chemical vapor deposition, physical vapor deposition, atomic layer deposition, thermally enhanced chemical vapor deposition, or any other formation technique. In some embodiments, plasma-enhanced chemical vapor deposition may be performed in a processing chamber, such as semiconductor processing chamber 100 described previously. Although the method 200 will discuss formation of silicon oxide followed by formation of germanium oxide, the formation order may be reversed in embodiments similarly encompassed by the present technology. Additionally, any number of layers of material may be produced in a stack, or any portion of any stack, and different portions of a stack may include more, less, or similar numbers of layers of any other portion of a stack according to embodiments of the present technology.

Method 200 may include providing a silicon-containing precursor to the processing region of the semiconductor processing chamber 100 at operation 205. Silicon-containing precursors that may be used may include, but are not limited to, silane ($SiH_4$), disilane ($Si_2H_6$), silicon tetrafluoride ($SiF_4$), silicon tetrachloride ($SiCl_4$), dichlorosilane ($SiH_2Cl_2$), tetraethyl orthosilicate (TEOS), as well as any other silicon-containing precursors that may be used in silicon oxide film formation. The method 200 may also include forming a plasma of the silicon-containing precursor in the processing region at operation 210. In embodiments, the plasma of the silicon-containing precursor may be formed by providing RF power to the faceplate to generate a plasma within the processing region, although any other processing chamber capable of producing plasma may similarly be used. Forming the plasma of the silicon-containing precursor may be performed at a plasma power of less than or about 500 W, and maybe performed at a plasma power of less than or about 475 W, less than or about 450 W, less than or about 425 W, less than or about 400 W, less than or about 375 W, less than or about 350 W, or lower, which may facilitate the formation of longer silicon-and-oxygen chains within the film produced.

After forming a plasma of the silicon-containing precursor, the method 200 may include forming a first layer of material on the substrate at operation 215. The first layer of material may include a silicon-containing material, such as silicon oxide. After deposition to a sufficient thickness, the flow of the silicon-containing precursor may be reduced or eliminated prior to proceeding to subsequent operations.

The method 200 may include providing a germanium-containing precursor to the processing region of the semiconductor processing chamber 100 at operation 220. Germanium-containing precursors that may be used may include, but are not limited to, germane ($GeH_4$), digermane ($Ge_2H_6$), germanium difluoride ($GeF_2$), germanium tetrafluoride ($GeF_4$), germanium dichloride ($GeCl_2$), germanium tetrabromide (GeBr$_4$), as well as any other germanium-containing precursors that may be used in germanium-containing, such as germanium oxide, film formation.

In any of operation 205 or operation 220, an oxygen-containing precursor may additionally be provided to the processing region of the semiconductor processing chamber 100. Oxygen-containing precursors that may be used include, but are not limited to, O$_2$, N$_2$O, NO$_2$, O$_3$, H$_2$O, as well as any other oxygen-containing precursors that may be used in silicon-containing, such as silicon oxide, film or germanium-containing, such as germanium oxide, film formation. When an oxygen-containing precursor is provided in both operation 205 and operation 220, the oxygen-containing precursor provided with the silicon-containing precursor at operation 205 may be a similar precursor as the oxygen-containing precursor provided with the germanium-containing precursor at operation 220. O$_2$ and O$_3$ may be similar precursors and N$_2$O and NO$_3$ may be similar precursors, as they contain similar constituent components. It is also contemplated that dissimilar oxygen-containing precursors may be used during operation 205 and operation 220. In some embodiments, a flow rate of the oxygen-containing precursor may be increased from a first flow rate provided while providing the silicon-containing precursor at operation 205 to a second flow rate while providing the germanium-containing precursor at operation 220. It is also contemplated that the flow rates of the oxygen-containing precursor may be substantially similar during operation 205 and operation 220. Similarly, a nitrogen-containing precursor may also be provided to the processing region of the semiconductor processing chamber 100. Nitrogen-containing precursors used during operation 205 or operation 220 may include N$_2$, N$_2$O, NO$_2$, NH$_3$, N$_2$H$_2$, as well as any other nitrogen-containing precursor that may be used in silicon-containing, including silicon oxide, film or germanium-containing, including germanium oxide, film formation. In any of operation 205 or operation 220, one or more additional precursors may be included, such as inert precursors, which may include Ar, He, Xe, Kr, nitrogen, or other precursors.

The oxygen-containing precursor may be flowed at a greater flow rate than either of the silicon-containing precursor or the germanium-containing precursor during formation of the silicon oxide and/or germanium oxide layers. For example, in some embodiments the oxygen-containing precursor may be flowed at a flow rate that is at least 10:1 compared to a flow rate of the silicon-containing precursor or the germanium-containing precursor, and may be greater than or about 20:1, greater than or about 30:1, greater than or about 40:1, greater than or about 50:1, greater than or about 60:1, greater than or about 70:1, greater than or about 80:1, greater than or about 90:1, greater than or about 100:1, or more. Similarly, in some embodiments, a flow rate of the oxygen-containing precursor may be increased from a first flow rate provided while providing the silicon-containing precursor at operation 205 to a second flow rate while providing the germanium-containing precursor at operation 220. By increasing the flow rate of the oxygen-containing precursor during the germanium film formation, a more oxygen-rich film may be formed. Accordingly, in some embodiments the oxygen-containing precursor may be flowed at a flow rate that is greater than or about 100:1 compared to the germanium-containing precursor, and may be greater than or about 200:1, greater than or about 300:1, greater than or about 400:1, greater than or about 500:1, greater than or about 600:1, greater than or about 700:1, greater than or about 800:1, greater than or about 900:1, greater than or about 1000:1, or more.

At operation 225 of method 200, a plasma of the germanium-containing precursor may be formed in the processing region. In embodiments, the plasma of the germanium-containing precursor may be formed by providing RF power to the faceplate to generate a plasma within the processing region, although any other processing chamber capable of producing plasma may similarly be used. Forming the plasma of the germanium-containing precursor may be performed at a plasma power of greater than or about 500 W, and maybe performed at a plasma power of greater than or about 550 W, greater than or about 600 W, greater than or about 650 W, greater than or about 700 W, greater than or about 750 W, greater than or about 800 W, greater than or about 850 W, greater than or about 900 W, greater than or about 950 W, greater than or about 1,000 W, or higher. The plasma power during the formation of the plasma of the germanium-containing may be necessary to create a rich oxygen radical environment. As further described below, an atomic ratio of germanium to oxygen of less than or about 3:2 in a second layer of material deposited on the first layer of material may be desirable. Thus, in order to achieve this atomic ratio, a plasma power greater than or about 500 W may be necessary to create a rich oxygen radical environment and to deposit sufficient oxygen in the second layer of material. If the plasma power is less than 500 W, the germanium atoms may begin to bond to one another and form areas of germanium-rich germanium oxide, which may undesirably increase the atomic ratio of germanium to oxygen, increasing the temperature susceptibility of the film produced. Further, maintaining a plasma power greater than or about 500 W may assist in separating the germanium atoms until they begin to oxidize.

After forming a plasma of the germanium-containing precursor, the method 200 may include forming the second layer of material on the substrate at operation 230. The second layer of material may include a germanium-containing material, such as germanium oxide. An atomic ratio of germanium to oxygen in the second layer of material may be less than or about 3:2, and may be less than or about 1:1, less than or about 1:2, less than or about 2:5, less than or about 1:3, less than or about 1:4, less than or about 1:5, or lower. A second layer of material with an atomic ratio of germanium to oxygen that is less than or about 3:2 may have increased thermal stability compared to layers of material having an atomic ratio of germanium to oxygen that is greater than 3:2. Layers of material having an atomic ratio of germanium to oxygen that is greater than 3:2 may not have a desirable thermal stability as the germanium atoms may diffuse into the adjacent layers during anneal operations, as further described below. As previously described, an oxygen-containing precursor may be provided in addition to the germanium-containing precursor at operation 220. This additional oxygen-containing precursor may contribute to increasing the oxygen concentration and, therefore, decreasing the atomic ratio of germanium to oxygen in the second layer of material.

The deposition at operation 205 and operation 220 may be performed at substrate or pedestal temperatures less than or about 550° C. Consequently, in some embodiments the deposition may occur at temperatures less than or about 525° C., less than or about 500° C., less than or about 475° C., less than or about 450° C., less than or about 425° C., less than or about 300° C., less than or about 375° C., less than or about 350° C., less than or about 325° C., less than or about 300° C., less than or about 275° C., less than or about 250°

C., less than or about 225° C., less than or about 200° C., or lower. Additionally, the deposition may be performed at a pressure of less than or about 6 Torr, such as less than or about 5 Torr, less than or about 4 Torr, less than or about 3 Torr, less than or about 2 Torr, less than or about 1 Torr, or lower. Operation 205 and 220 may be formed at the same or similar process conditions. For example, the temperature and/or pressure may be maintained for both the formation of the first layer of material and the second layer of material. Conversely, the temperature and/or pressure may be modified or adjusted between the formation of the first layer of material and the second layer of material. Further, the temperature and/or pressure may be modified or adjusted between the formation of various layers in the alternating layers in the structure 300.

Each of the first layer of material and the second layer of material may have a substantially similar thickness. For example, the thickness of the first layer of material and the second layer of material may have a thickness within about 5 nm of one another, and may have a thickness within about 4 nm of one another, within about 3 nm of one another, within about 2 nm of one another, within about 1 nm of one another, or less. In embodiments, the first layer of material and the second layer of material may have a thickness greater than or about 10 nm, such as greater than or about 12 nm, greater than or about 14 nm, greater than or about 16 nm, greater than or about 18 nm, greater than or about 20 nm, or higher. Further, the first layer of material and the second layer of material may have a thickness less than or about 30 nm, such as less than or about 28 nm, less than or about 26 nm, less than or about 24 nm, less than or about 22 nm, less than or about 20 nm, or lower. In some embodiments, each layer of material may have a thickness between about 10 nm and about 30 nm.

Method 200 may include repeating operation 205 through operation 230 at operation 235 to form alternating sets of the first layer of material and the second layer of material. These operations may be repeated any number of times until a predetermined number of pairs of layers may be formed that may constitute a stack of layers. As previously discussed, FIG. 3A illustrates the structure 300 including the substrate 305 having a stack 310 of alternating layers of silicon oxide and germanium oxide. The illustrated stack 310 may include a number of portions 315, which may each include at least one layer of silicon oxide material 317, and at least one layer of germanium oxide material 319. Each portion may also include multiple pairs of layers including greater than or about 2 pairs, greater than or about 10 pairs, greater than or about 50 pairs, greater than or about 100 pairs, or more pairs of layers. In total, the structure 300 may include at least 10 layers of alternating layers of the first layer of material and the second layer of material, and may include at least 30 layers, at least 50 layers, at least 100 layers, at least 150 layers, or more. Any specific number of pairs encompassed by any of these stated ranges is to be understood as if specifically stated here. Although three portions, 315*a*, 315*b*, and 315*c* are illustrated, more or less portions may be included according to some embodiments of the present technology.

An optional anneal may also be performed at operation 240, which may raise the temperature of the formed films, either with or without increased oxygen concentration in the materials. The anneal may include a process increasing the temperature of the structure to greater than or about 500° C., and which may increase the temperature of the first portion of the stack greater than or about 550° C., greater than or about 600° C., greater than or about 650° C., greater than or about 700° C., greater than or about 750° C., greater than or about 800° C., greater than or about 850° C., greater than or about 900° C., or higher. Operation 240 may be formed multiple times during method 200. For example, a first anneal may be performed after formation of the first portion 315*a* and prior to the formation of the second portion 315*b*. By performing an anneal between forming the first portion 315*a* and the second portion 315*b*, outgassing may occur to limit deformation of the structure during any subsequent processing.

As previously discussed, the atomic ratio of germanium to oxygen in the second layer of material may be less than or about 3:2. If the atomic ratio of germanium to oxygen is too high, such as greater than 3:2, the germanium oxide layer may lack desirable stability during the anneal operation. For example, during the anneal operation if the atomic ratio of germanium to oxygen is greater than 3:2, the germanium may diffuse in the adjacent silicon oxide layers. For example, if the atomic ratio of germanium to oxygen is greater than 3:2, the silicon oxide and germanium oxide layers may become totally soluble during the anneal and combine into one homogenous layer.

After forming the structure 300, the structure may be further processed in preparation for use, such as for 3D NAND. In subsequent processing, and as shown in FIG. 3B, a number of memory holes or apertures may be etched into the structure 301. A hard mask may be applied to the structure 300 and high aspect ratio memory holes may be etched into the structure 301. The memory holes may be trenches or channels that are etched from the top of the structure 301 into the substrate 315. After the memory holes are etched, additional deposition and etching processes may be performed prior to removing the remaining geranium oxide material.

In conventional structures having alternating layers of silicon oxide and silicon nitride, the process of etching the memory holes may be difficult. Etch processes performed may not have sufficient selectivity between the two materials, which may cause incomplete removal of silicon nitride, as well as over etch of silicon oxide, which may damage the cell structures. Conversely, germanium oxide may be etched more readily by dry etch processes with increased selectivity to silicon oxide, which may both increase removal of germanium oxide as well as control losses of silicon oxide throughout the structure. Germanium oxide may be characterized by a reduced hardness relative to silicon nitride, which may facilitate memory hole formation, and allow thinner hardmasks to be used, as well as to limit interfacial residence time of etch processing, which may otherwise damage silicon oxide in conventional processing of silicon nitride.

After etching the memory hole and any additional deposition and/or etching processes related to memory cell formation, which those skilled in the art will appreciate, the remaining germanium oxide material may be removed. The germanium oxide that is removed may be replaced with a metal-continuing material, such as tungsten. During the etch to remove silicon nitride of conventional structures, poor removal capability of the silicon nitride may be realized. When a silicon nitride layer is used, as opposed to a germanium oxide layer as in the present disclosure, a wet etch using phosphoric acid ($H_3PO_4$) is necessary. During this wet etch removal of silicon nitride, a silicon oxide byproduct may be formed. A portion of this silicon oxide byproduct may deposit on the existing silicon oxide layer in the structure. This inadvertent deposition of silicon oxide during silicon nitride removal may create a mismatched shape of the existing silicon oxide layer, which may be undesirable.

In embodiments of the present disclosure, where a germanium oxide layer is used in place of a silicon nitride layer, a wet etch may not be necessary. Instead, a dry etch may be performed using a hydrogen-containing gas and/or an argon-containing gas. In such embodiments, a plasma may be formed from the hydrogen-containing gas to etch the germanium oxide material, and one or more carrier gases, such as argon, for example, may be included for plasma stability. This dry etch using hydrogen-containing gas may etch the germanium oxide material without substantially etching the silicon oxide material. Further, this dry etch may be performed in the same semiconductor processing chamber 100 used to form the structure. While a wet etch of germanium oxide using water is possible, such a wet etch may result in bending of the silicon oxide layer, surface tension effects, and more.

By utilizing one or more of the described processes, improved removal of material and, therefore, more uniform formation of memory holes may be afforded, which may limit difficulties in stack processing and eventual removal of the material to be replaced with the metal-containing material, as well as improve uniformity of a profile through the memory hole. Consequently, improved fabrication may be afforded by the present technology, which may produce more uniform stack structures over conventional technologies.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology. Additionally, methods or processes may be described as sequential or in steps, but it is to be understood that the operations may be performed concurrently, or in different orders than listed.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a silicon-containing precursor" includes a plurality of such precursors, and reference to "the first layer of material" includes reference to one or more layers and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A semiconductor processing method comprising:
providing a silicon-containing precursor to a processing region of a semiconductor processing chamber, wherein a substrate is disposed within the processing region of the semiconductor processing chamber;
forming a plasma of the silicon-containing precursor in the processing region;
forming a first layer of material on the substrate, wherein the first layer of material comprises silicon oxide;
providing a germanium-containing precursor to the processing region of the semiconductor processing chamber;
forming a plasma of the germanium-containing precursor in the processing region, wherein forming the plasma of the germanium-containing precursor is performed at a plasma power of greater than or about 500 W; and
forming a second layer of material on the substrate, wherein the second layer of material comprises germanium oxide.

2. The semiconductor processing method of claim 1, wherein a temperature within the semiconductor processing chamber is maintained at less than or about 550° C. while forming the first layer of material and the second layer of material on the substrate.

3. The semiconductor processing method of claim 1, wherein a pressure within the semiconductor processing chamber is maintained at less than or about 6 Torr while forming the first layer of material and the second layer of material on the substrate.

4. The semiconductor processing method of claim 1, wherein forming the plasma of the silicon-containing precursor is performed at a plasma power of less than or about 500 W.

5. The semiconductor processing method of claim 1, wherein forming the plasma of the germanium-containing precursor is performed at a plasma power of greater than or about 900 W.

6. The semiconductor processing method of claim 1, wherein an atomic ratio of germanium to oxygen in the second layer of material is less than or about 1:2.

7. The semiconductor processing method of claim 1, where each layer of material has a thickness between about 10 nm and about 30 nm.

8. The semiconductor processing method of claim 1, further comprising:
forming alternating sets of the first layer of material and the second layer of material on the substrate.

9. The semiconductor processing method of claim 8, further comprising:
annealing the substrate subsequent forming alternating sets of the first layer of material and the second layer of material.

10. A semiconductor processing method comprising:

forming a first layer of material on a substrate in a processing region of a semiconductor processing chamber, wherein the first layer of material comprises silicon oxide, forming a second layer of material on the substrate, wherein the second layer of material comprises germanium oxide, and wherein an atomic ratio of germanium to oxygen in the second layer of material is less than or about 3:2; and annealing the substrate subsequent forming the first layer and the second layer on the substrate.

11. The semiconductor processing method of claim 10, wherein a temperature within the semiconductor processing chamber is maintained at less than or about 550° C. while forming the first layer of material and the second layer of material on the substrate.

12. The semiconductor processing method of claim 10, wherein a pressure within the semiconductor processing chamber is maintained at less than or about 6 Torr while forming the first layer of material and the second layer of material on the substrate.

13. The semiconductor processing method of claim 10, wherein the atomic ratio of germanium to oxygen in the second layer of material is less than or about 2:3.

14. The semiconductor processing method of claim 10, further comprising:

forming a plasma of a germanium-containing precursor in the processing region prior to forming the second layer of material on the substrate, wherein forming the plasma of the germanium-containing precursor is performed at a plasma power of greater than or about 900 W.

15. The semiconductor processing method of claim 10, further comprising:

forming alternating sets of the first layer of material and the second layer of material on the substrate, wherein the alternating sets of the first layer of material and the second layer of material comprise at least 50 layers of alternating layers of silicon oxide and germanium oxide.

16. A semiconductor processing method comprising:

providing a silicon-containing precursor and an oxygen-containing precursor to a processing region of a semiconductor processing chamber, wherein a substrate is disposed within the processing region of the semiconductor processing chamber;

forming a plasma of the silicon-containing precursor and the oxygen-containing precursor in the processing region;

forming a first layer of material on the substrate, wherein the first layer of material comprises silicon oxide;

providing a germanium-containing precursor and an oxygen-containing precursor to the processing region of the semiconductor processing chamber;

forming a plasma of the germanium-containing precursor and the oxygen-containing precursor in the processing region; and forming a second layer of material on the substrate, wherein the second layer of material comprises germanium oxide, and wherein a ratio of germanium to oxygen in the second layer of material is less than or about 1:2.

17. The semiconductor processing method of claim 16, wherein forming the plasma of the germanium-containing precursor is performed at a plasma power of greater than or about 800 W.

18. The semiconductor processing method of claim 16, wherein:

a temperature within the semiconductor processing chamber is maintained at less than or about 550° C. while forming the first layer of material and the second layer of material on the substrate; and a pressure within the semiconductor processing chamber is maintained at less than or about 6 Torr while forming the first layer of material and the second layer of material on the substrate.

19. The semiconductor processing method of claim 16, wherein the oxygen-containing precursor provided with the silicon-containing precursor is a similar precursor as the oxygen-containing precursor provided with the germanium-containing precursor.

20. The semiconductor processing method of claim 19, wherein a flow rate of the oxygen-containing precursor is increased from a first flow rate provided while providing the silicon-containing precursor to a second flow rate while providing the germanium-containing precursor.

* * * * *